United States Patent
Daio

(10) Patent No.: US 6,624,676 B2
(45) Date of Patent: Sep. 23, 2003

(54) ASYMMETRY DETECTION CIRCUIT AND DETECTION METHOD OF SAME

(75) Inventor: Katsuhisa Daio, Kagoshima (JP)

(73) Assignee: Sony Corporation, Tokyo (JP)

( * ) Notice: Subject to any disclaimer, the term of this patent is extended or adjusted under 35 U.S.C. 154(b) by 133 days.

(21) Appl. No.: 09/930,179

(22) Filed: Aug. 16, 2001

(65) Prior Publication Data

US 2002/0030477 A1 Mar. 14, 2002

(30) Foreign Application Priority Data

Aug. 23, 2000 (JP) .......................................... 2000-258131

(51) Int. Cl.$^7$ .............................................. H03K 3/017

(52) U.S. Cl. ....................... 327/175; 327/100; 327/165; 327/307

(58) Field of Search ................................. 327/100, 165, 327/167, 175, 307, 309, 318–322, 331

(56) References Cited

U.S. PATENT DOCUMENTS 6,066,972 A * 5/2000 Strom ........................ 327/175

* cited by examiner

*Primary Examiner*—Kenneth B. Wells
(74) *Attorney, Agent, or Firm*—Rader, Fishman & Grauer PLLC; Ronald P. Kananen, Esq.

(57) ABSTRACT

An asymmetry detection circuit having a simple circuit configuration capable of realizing reliable detection without dependence on the signal level and capable of realizing high precision asymmetry detection almost completely free of any influence from a voltage offset or the like, and a detection method of same, wherein a capacitor cuts off the direct current component of an input signal and passes the alternating current component, a bias voltage is added to the alternating current component in accordance with a constant voltage of a constant voltage source to generate an APL clamp signal, a comparator compares the signal with a constant voltage and outputs a pulse voltage signal representing a duty ratio of the signal in the APL value, a voltage/current conversion circuit outputs a current signal to charge or discharge a capacitor to generate an integrated signal, and a filter eliminates the alternating current component of the integrated signal and outputs the direct current component as an asymmetry detection signal.

5 Claims, 3 Drawing Sheets

US 6,624,676 B2

ASYMMETRY DETECTION CIRCUIT AND DETECTION METHOD OF SAME

BACKGROUND OF THE INVENTION

1. Field of the Invention

The present invention relates to an asymmetry detection circuit for detecting the asymmetry of alternating current signals and a detection method of the same.

2. Description of the Related Art

In an asymmetry correction circuit or the like, in order to correct the asymmetry of alternating current signals, first the asymmetry of an input signal must be detected.

Conventionally, the asymmetry of alternating current signals has been detected by comparing the bias voltages of the signals with an intermediate potential of a signal amplitude. FIG. 4 shows an example of the conventional asymmetry detection circuit. As illustrated, this asymmetry detection circuit 200 is comprised of peak hold circuits 210 and 220, an intermediate voltage detection circuit 230, and an asymmetry processing circuit 240.

The peak hold circuit 210 holds the upper limit value (positive peak level $S_{PK1}$) of an input signal $S_{in}$, while the peak hold circuit 220 holds the lower limit value (negative peak level $S_{PK2}$) of the same input signal Sin.

The intermediate voltage detection circuit 230 detects the intermediate voltage of the input signal $S_{in}$ in accordance with the positive peak level $S_{PK1}$ and the negative peak level $S_{PK2}$ found by the peak hold circuits 210 and 220.

Here, assume that, for example, the input signal $S_{in}$ has the waveform shown in FIG. 5. The peak hold circuit 210 detects the positive peak level $S_{PK1}$ of this input signal $S_{in}$, while the peak hold circuit 220 detects the negative peak level $S_{PK2}$. The intermediate voltage detection circuit 230 finds an intermediate voltage $V_2$ of the input signal $S_{in}$, by the following equation based on the positive and negative peak levels $S_{PK1}$ and $S_{PK2}$ and outputs a signal $S_M$ indicating the intermediate voltage to the asymmetry processing circuit 240.

$$V_2 = (S_{PK1} - S_{PK2})/2 \qquad (1)$$

Namely, the intermediate voltage $V_2$ is the voltage in the middle of the positive peak level $S_{PK1}$ and the negative peak level $S_{PK2}$ of the input signal $S_{in}$ in the waveform of the input signal $S_{in}$ shown in FIG. 5 and is a voltage value where a=b stands as illustrated.

The asymmetry processing circuit 240 calculates the asymmetry of the signal $S_{in}$ according to the bias voltage $V_1$ of the input signal $S_{in}$ and the intermediate voltage $V_2$ thereof.

The asymmetry of alternating current signals is defined as the ratio of upper and lower peak voltages with respect to the direct current voltage level by which the duty ratio of the alternating current signals becomes 50%. The asymmetry processing circuit 240 can calculate the asymmetry of the input signal Sin based on the bias voltage $V_1$ of the input signal Sin and the intermediate voltage $V_2$ detected by the intermediate voltage detection circuit 230 according to this definition.

Summarizing the problem to be solved by the invention, in a conventional asymmetry detection circuit, in order to find the asymmetry of an input signal, first the positive and negative peak levels of the,signal are detected by the peak hold circuits, and then the intermediate voltage $V_1$ of the signal amplitude is detected in accordance with the result. Therefore, the positive peak hold circuit and the negative peak hold circuit become necessary. The precision of the found intermediate voltage is largely governed by the holding characteristics of these circuits.

On the other hand, there is no problem as long as the voltage applied to the alternating current signal as the reference bias voltage $V_1$ is clear, but if an offset or the like of the signal occurs in the middle of the path, the precision of the bias voltage $V_1$ is lowered. For example, when viewed by the path up to a comparison circuit for comparing the bias voltage $V_1$ and the intermediate voltage $V_2$ of the amplitude of the signal (not illustrated: for example, existing inside the asymmetry processing circuit 240), the precision of the two are liable to differ and the precision of detection of the asymmetry is liable to fall due to an offset occurring in the peak hold circuit for finding the intermediate voltage $V_2$.

In order to prevent such a fall of the precision of detection of asymmetry, a correction must be carried out in each circuit or the precision of detection of each circuit block must be raised, so there are the disadvantages of increased complexity of the system, sensitivity to fluctuations of measurement conditions or the signal level, and susceptability to interference.

SUMMARY OF THE INVENTION

An object of the present invention is to provide an asymmetry detection circuit having a simple circuit configuration capable of realizing reliable detection without depending upon the signal level and realizing high precision asymmetry detection almost entirely free from the influence of voltage offset or the like and a detection method of the same.

To attain the above object, according to a first aspect of the invention, there is provided an asymmetry detection circuit having an alternating current separation means for outputting an alternating current component of an input signal, a clamping means for adding a predetermined bias voltage to the alternating current signal obtained from said alternating current separation means, a comparing means for comparing the output of said clamping means with a reference voltage in accordance with said bias voltage and outputting a pulse signal in accordance with the duty ratio of the output signal of said clamping means in accordance with the related comparison result, a voltage/current converting means for converting said pulse signal to a current signal, an integrating means for integrating said current signal and outputting an integrated signal, and a filter for eliminating the alternating current component of said integrated signal and outputting a direct current component.

Preferably, said alternating current separation means comprises a capacitor cutting off the direct current component.

Preferably, said integrating means comprises a capacitor charged or discharged by said current signal.

Preferably, said filter comprises a low pass filter.

According to a second aspect of the present invention, there is provided an asymmetry detection method for detecting the asymmetry of an input signal, comprised of the steps of cutting off a direct current component of said input signal and outputting an alternating current component, adding a predetermined bias voltage to said alternating current component and clamping said input signal by the related bias voltage, comparing said clamped signal and the reference voltage in accordance with said bias voltage and outputting a pulse signal representing the duty ratio of said clamped signal in accordance with the related comparison result, converting said pulse signal to a current signal, integrating said current signal and outputting an integrated signal, and eliminating the alternating current component of said integrated signal and outputting the direct current component.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Figure 1:
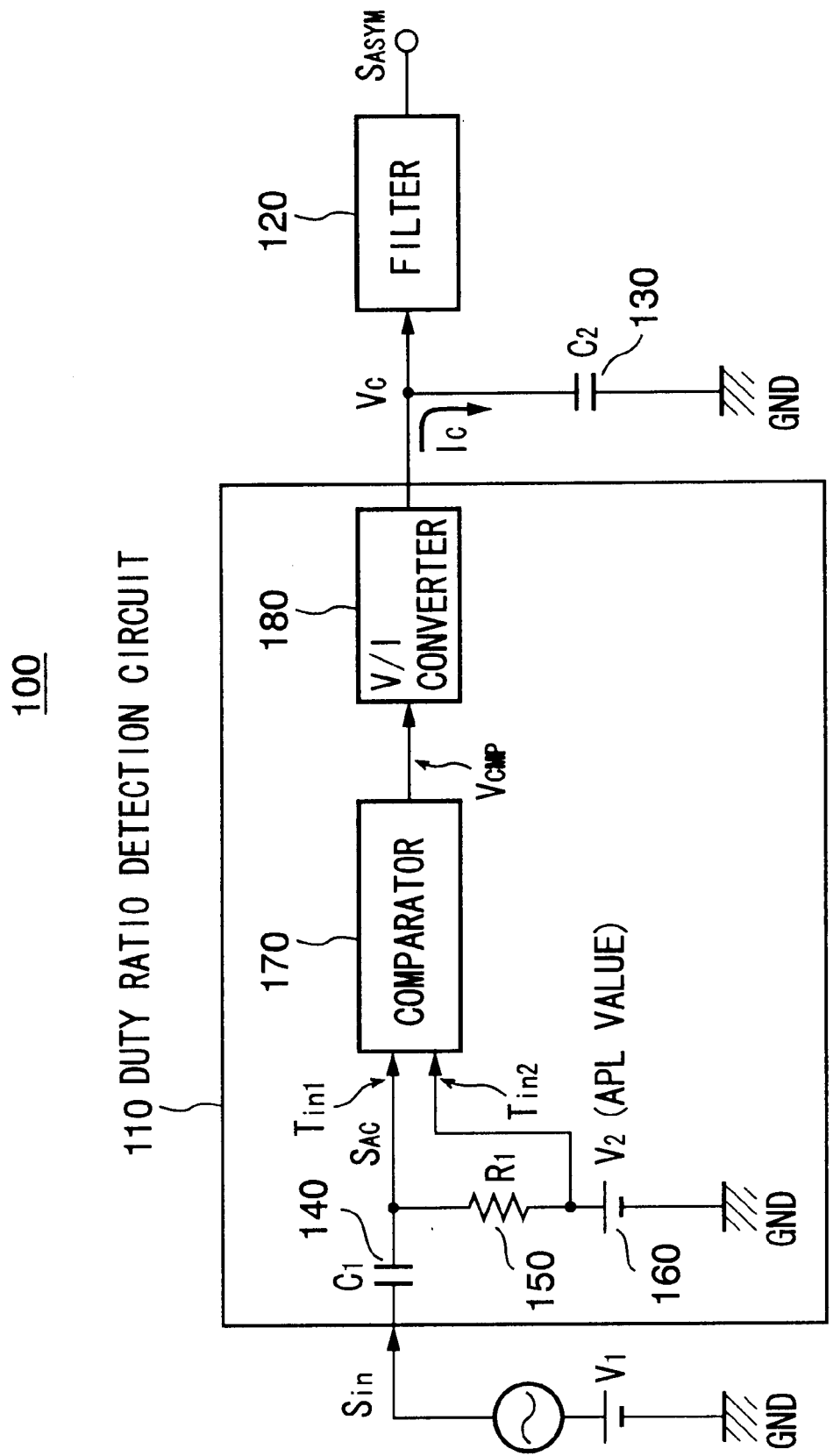
FIG. 1 is a circuit diagram of an embodiment of an asymmetry detection circuit according to the present invention.

FIG. 1 is a circuit diagram of an embodiment of an asymmetry detection circuit according to the present invention.

As illustrated, an asymmetry detection circuit 100 of the present embodiment is constituted by a duty ratio detection circuit 110, a filter 120, and a capacitor 130 (C2).

The duty ratio detection circuit 110 is comprised of a capacitor 140 ($C_1$), a resistor 150 ($R_1$), a constant voltage source 160 ($V_2$), a comparator 170, and a voltage/current converter (V/I converter) 180.

Below, an explanation will be given of the configurations and functions of parts of the asymmetry detection circuit of the present invention by referring to FIG. 1.

In the duty ratio detection circuit 110, the capacitor 140 cuts off the direct current component of the input signal $S_{in}$ and allows only the alternating current component to pass through.

The constant voltage source 160 supplies a constant voltage $V_2$ as the reference voltage.

The capacitor 140, the resistor 150, and the constant voltage source 160 give a bias voltage in accordance with the constant voltage $V_{in}$ to the input signal $S_{in}$ as an average picture level (APL) value. Namely, the input signal $S_{in}$ is clamped according to the constant voltage $V_2$.

As illustrated, the input signal $S_{in}$ is input to one input terminal $T_{in1}$ of the comparator 170 via the capacitor 140. The resistor 150 and the constant voltage source 160 are connected in series between the input terminal $T_{in1}$ of the comparator 170 and a reference potential (ground potential) GND. A middle point of connection of the resistor 150 and the constant voltage source 160 is connected to the other input terminal $T_{in2}$ of the comparator 170.

For this reason, a signal $S_{AC}$ obtained by APL clamping the input signal $S_{in}$ is applied to the input terminal $T_{in1}$ of the comparator 170, and the constant voltage $V_2$ is input as the reference voltage to the input terminal $T_{in2}$.

The comparator 170 compares the signal $S_{AC}$ and the reference voltage V2 and outputs a pulse voltage signal $V_{CMP}$ in accordance with the result of comparison. In the comparator 170, the reference voltage for comparison of the signal $S_{AC}$ is the APL value. Therefore, as a result of comparison of these signals, a voltage pulse $V_{CMP}$ in accordance with the duty ratio in the APL value is output.

The voltage/current conversion circuit 180 converts the input voltage signal to a current signal. Namely, the voltage/current conversion circuit 180 outputs a current IC in accordance with the voltage $V_{CMP}$ output by the comparator 170.

The capacitor 130 is charged or discharged by the current $I_C$ output by the voltage/current conversion circuit 180. Due to this, an integrated voltage $V_C$ is obtained from the terminal of the capacitor 130 in accordance with the output current $I_C$.

The integrated voltage $V_C$ obtained by the capacitor 130 is input to the filter 120. The filter 120 is comprised of, for example, a low pass filter. The alternating current signal component contained in the integrated voltage $V_C$ is eliminated by the low pass filter. As a result, the direct current component contained in the integrated voltage $V_C$ is output. The direct current component is output as an asymmetry detection result $S_{ASYM}$ of the input signal $S_{in}$.

Next, an explanation will be given of the principle of asymmetry detection in the present embodiment by referring to the waveform diagrams shown in FIG. 2 and FIG. 3.

Figure 2:
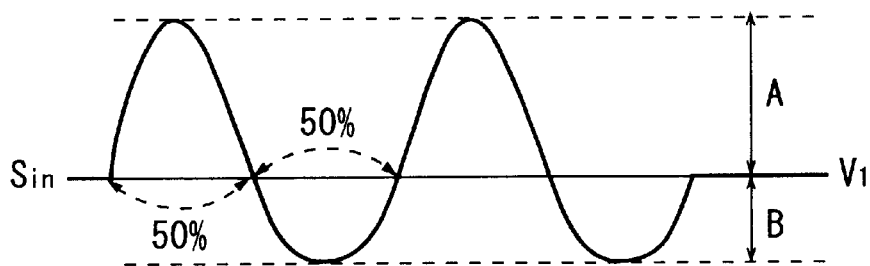
FIG. 2 is a waveform diagram showing a definition of asymmetry.

FIG. 2 is a waveform diagram of the definition of asymmetry of alternating current signals. The asymmetry of the alternating current signals is defined as the ratio between the upper limit peak value and the lower limit peak value with respect to the direct current voltage value by which the duty ratio becomes 50%.

As illustrated, it is assumed that the duty ratio becomes 50% when the alternating current signal $S_{in}$ is clamped by the voltage $V_1$. At this time, when the upper limit value of the signal $S_{in}$, that is, the positive peak level, is A, and the lower limit value, that is, the negative peak level, is B with respect to the voltage $V_1$, the asymmetry ASYM of the signal $S_{in}$ is found by the following equation:

$$\text{ASYM}=(A-B)/(A+B)\times 100\% \qquad (2)$$

According to equation (2), the case where the asymmetry ASYM is 0% arises when the upper limit value and the lower limit value are equal and A=B. Namely, when the asymmetry ASYM is 0%, the alternating current signals exhibit completely vertically symmetrical shapes.

Here, consider a triangle with a bottom side set at the duty ratio and with a height set at the peak value (upper limit value or lower limit value). As areas of this triangle, a positive side area $S_P$ and a negative side area Sn can be found as follows.

$$S_p = 50 \times A/2 \qquad (3)$$

$$S_n = 50 \times B/2 \qquad (4)$$

Figure 3:
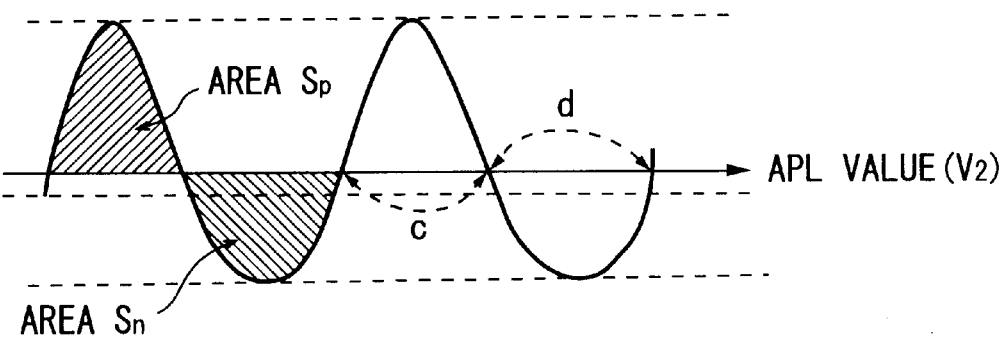
FIG. 3 is a waveform diagram showing a principle of asymmetry detection in the present embodiment.
Figure 4:
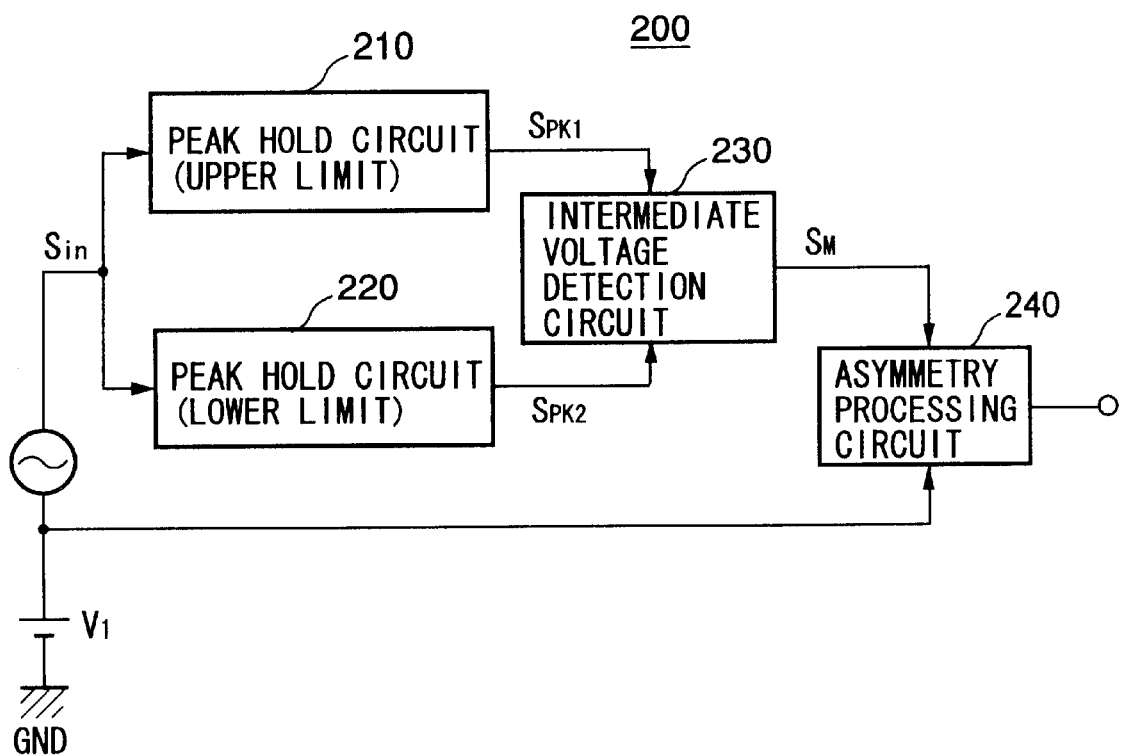
FIG. 4 is a circuit diagram showing an example of a conventional asymmetry detection circuit.
Figure 5:
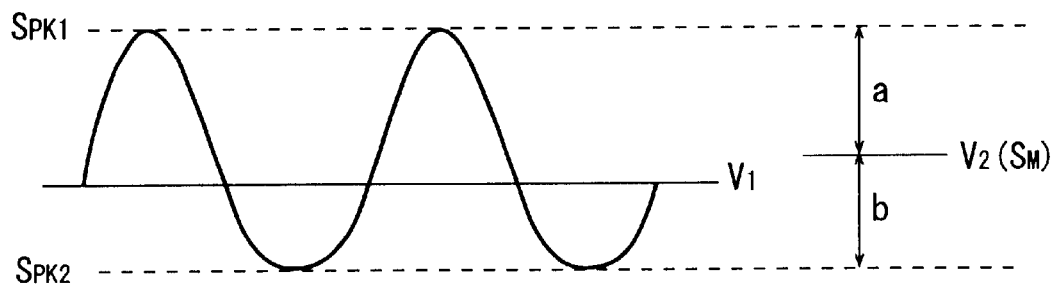
FIG. 5 is a waveform diagram showing a principle of detection of the conventional asymmetry detection circuit.

FIG. 3 shows the area $S_p$ and the area $S_n$ with respect to the case where the input signal S in has the APL value (voltage V2).

When the asymmetry is 0, $S_P$ and $S_n$ found according to equations (3) and (4) satisfy the following equation:

$$S_P = S_n \qquad (5)$$

On the other hand, when the asymmetry is a number other than 0, $S_P$ and $S_n$ found according to equations (3) and (4) satisfy the following equation:

$$S_P \neq S_n \qquad (6)$$

On the other hand, the APL value is the average value of the alternating current signals, and so is a direct current voltage value always satisfying equation (5). When the asymmetry is a number other than 0, A is not equal to B. In the APL value, by equation (5), the duty ratio does not become equal to 50%.

Namely, even if the peak level of the alternating current signals is not monitored, by monitoring the duty ratio in the APL value of the alternating current signals, the asymmetry of the alternating current signals can be detected.

Below, an explanation will be given of operation of the asymmetry detection in the asymmetry detection circuit of the present embodiment by referring to FIG. 1.

First, the input alternating current signal $S_{in}$ is input to the duty ratio detection circuit 110. In the duty ratio detection circuit 110, the direct current component of the input signal $S_{in}$ is cut off by the capacitor 140. Further, by the resistor 150 and the constant voltage source 160, the signal SAC APL clamped at the constant voltage $V_2$ is obtained and input to the input terminal $T_{in1}$ of the comparator 170. The constant voltage $V_2$ is input as a comparison reference voltage to the input terminal $T_{in2}$ of the comparator 170.

In the comparator 170, signals input to the input terminals $T_{in1}$ and $T_{in2}$ are compared. As a result of this comparison, a voltage pulse $V_{CMP}$ indicating the duty ratio in the APL value is output. Namely, the duty ratio of the input signal Sin with respect to the APL value is represented by the pulse width of the output pulse signal $V_{CMP}$ of the comparator 170.

The voltage pulse signal $V_{CMP}$ output from the comparator 170 is input to the voltage/current conversion circuit 180. As a result of the conversion, a current signal $I_C$ in accordance with the voltage pulse signal $V_{CMP}$ is output.

The capacitor 130 is charged or discharged by the current signal $I_C$. Namely, the current signal $I_C$ is integrated, and a voltage $V_C$ is obtained as the integrated signal from the terminal of the capacitor 130.

The alternating current component of the integrated signal $V_C$ is eliminated by the filter 120 and only the direct current component is output. This output signal indicates the asymmetry of the input signal $S_{in}$ and is output as the asymmetry detection signal $S_{ASYM}$.

As explained above, according to the present embodiment, by just using a simple circuit, it is possible to detect reliably the asymmetry of the input signal. Also, in the duty ratio detection circuit, since the APL value is given by the constant voltage source, the signal $S_{AC}$ obtained by clamping the input signal $S_{in}$ by the APL value is generated, and the signal $S_{AC}$ and the voltage $V_2$ of the constant voltage source serving as the reference voltage are compared by the comparator 170, and the duty ratio can be correctly detected. By the voltage/current conversion circuit 180, the duty ratio detection result is converted to the current signal $I_C$, the integrated signal $V_C$ is found by the capacitor 130 in accordance with that, and the asymmetry can be detected in accordance with the direct current component of the integrated signal. For this reason, it is possible to detect reliably the asymmetry almost completely free of any influence from fluctuation of the signal. Further, the circuit configuration is extremely simple. For example, for the comparison circuit 170, the voltage/current conversion circuit 180, and the filter 120, it is not necessary to use particularly limited elements. Already existing elements can be used. Therefore, development and manufacturing costs of a system including an asymmetry detection circuit can be kept low.

Summarizing the effects of the invention, as explained above, according to the asymmetry detection circuit of the present invention and the detection method of the same, asymmetry can be reliably detected by a simple circuit configuration and the result of detection of asymmetry is obtained based on the result of integration of the signal, so not only can the detection result be output as a voltage signal, but also reliable detection can be realized without dependance on the fluctuation of the level of the input signal.

Further, according to the present invention, there is almost no influence of direct current offset of the input signal and offset occurring in the signal processing circuit, so there is the advantage that a high precision can be held in the result of detection of asymmetry.

While the invention has been described with reference to specific embodiments chosen for the purpose of illustration, it should be apparent that numerous modifications could be made thereto by those skilled in the art without departing from the basic concept and scope of the invention.

What is claimed is:

1. An asymmetry detection circuit comprising an alternating current separation means for outputting an alternating current component of an input signal, a clamping means for adding a predetermined bias voltage to the alternating current signal obtained from said alternating current separation means, a comparing means for comparing the output of said clamping means with a reference voltage in accordance with said bias voltage and outputting a pulse signal in accordance with the duty ratio of the output signal of said clamping means in accordance with the comparison result, a voltage/current converting means for converting said pulse signal to a current signal, an integrating means for integrating said current signal and outputting an integrated signal, and a filter for eliminating the alternating current component of said integrated signal and outputting a direct current component.

2. An asymmetry detection circuit as set forth in claim 1, wherein said alternating current separation means comprises a capacitor cutting off the direct current component.

3. An asymmetry detection circuit as set forth in claim 1, wherein said integrating means comprises a capacitor charged or discharged by said current signal.

4. An asymmetry detection circuit as set forth in claim 1, wherein said filter is a low pass filter.

5. An asymmetry detection method for detecting the asymmetry of an input signal, comprised of the steps of cutting off a direct current component of said input signal and outputting an alternating current component, adding a predetermined bias voltage to said alternating current component and clamping said input signal by the bias voltage, comparing said clamped signal and the reference voltage in accordance with said bias voltage and outputting a pulse signal representing the duty ratio of said clamped signal in accordance with the comparison result, converting said pulse signal to a current signal, integrating said current signal and outputting an integrated signal, and eliminating the alternating current component of said integrated signal and outputting the direct current component.

* * * * *